United States Patent
Lin et al.

(10) Patent No.: US 7,723,789 B2
(45) Date of Patent: May 25, 2010

(54) NONVOLATILE MEMORY DEVICE WITH NANOWIRE CHANNEL AND METHOD FOR FABRICATING THE SAME

(75) Inventors: Horng-Chih Lin, Hsinchu (TW); Chun-Jung Su, Gueiren Township, Tainan County (TW); Hsin-Hwei Hsu, Taipei (TW)

(73) Assignee: National Chiao Tung University, Hsinchu (TW)

( * ) Notice: Subject to any disclaimer, the term of this patent is extended or adjusted under 35 U.S.C. 154(b) by 283 days.

(21) Appl. No.: 12/025,570

(22) Filed: Feb. 4, 2008

(65) Prior Publication Data
US 2009/0065852 A1 Mar. 12, 2009

(30) Foreign Application Priority Data
Sep. 11, 2007 (TW) ............................... 96133872 A

(51) Int. Cl.
*H01L 29/786* (2006.01)
*H01L 21/00* (2006.01)

(52) U.S. Cl. ................... 257/349; 257/315; 257/324; 257/326; 257/327; 257/331; 257/623; 257/E21.301; 257/E21.423; 257/E29.242; 257/E29.309; 438/149; 438/156; 438/157; 438/197; 438/689; 365/158; 365/184

(58) Field of Classification Search .................. 257/315, 257/317, 326, 330, 349, 623, E21.301, E21.415, 257/E21.423, E29.242, E29.309; 365/158, 365/184; 438/149, 156, 157, 197, 689
See application file for complete search history.

(56) References Cited

U.S. PATENT DOCUMENTS

| 7,456,476 | B2 * | 11/2008 | Hareland et al. | 257/349 |
| 7,485,520 | B2 * | 2/2009 | Zhu et al. | 438/197 |
| 2004/0235300 | A1 * | 11/2004 | Mathew et al. | 438/689 |
| 2009/0010056 | A1 * | 1/2009 | Kuo et al. | 365/184 |

FOREIGN PATENT DOCUMENTS

TW I246541 12/2004

OTHER PUBLICATIONS

P. Xuan et al., "FinFET SONOS Flash Memory for Embedded Applications," in IEDM Tech. Dig., pp. 609-613 (2003).
X. Duan et al., "Nonvolatile Memory and Programmable Logic from Molecule-Gated Nanowires," Nano Lett., vol. 2, pp. 487-490 (2002).

* cited by examiner

*Primary Examiner*—Dao H Nguyen
(74) *Attorney, Agent, or Firm*—Rosenberg, Klein & Lee

(57) ABSTRACT

A nonvolatile memory device with nanowire channel and a method for fabricating the same are proposed, in which side etching is used to shrink side walls of a side-gate to form a nanowire pattern, thereby fabricating a nanowire channel on the dielectric of the side walls of the side-gate. A nonvolatile memory device with nanowire channel and dual-gate control can thus be achieved. This nonvolatile memory device can enhance data writing and erasing efficiency, and also has the capability of low voltage operation. Moreover, through a process of low cost and easy steps, highly reproducible and mass producible fabrication of nanowire devices can be accomplished.

13 Claims, 4 Drawing Sheets

NONVOLATILE MEMORY DEVICE WITH NANOWIRE CHANNEL AND METHOD FOR FABRICATING THE SAME

BACKGROUND OF THE INVENTION

1. Field of the invention

The present invention relates to a nonvolatile memory device and a method for fabricating the same and, more particularly, to a nonvolatile memory device with nanowire channel and a method for fabricating the same.

2. Description of Related art

General nonvolatile memory devices can make use of multiple-gate structure and ultra-thin channel to enhance the control capability over channel in order to increase data writing/erasing efficiency. FinFETs and nanowire FETs are common selections. In ordinary industrial circles, however, it is usually necessary to use E-beam and silicon on insulator (SOI) wafer material for the fabrication of ultra-thin channel devices. Therefore, both the cost and the technology threshold are high. In addition, general academic circles fabricate nanowire in a bottom-up manner. Although the cost is not high, there exist the problems of reproducibility, reliability and mass production. Moreover, when fabricating FETs, it is difficult to align electrode and nanowire. Therefore, there are many improvements to be made in practical application.

For instance, Taiwan Pat. No. 1,246,541 discloses a fabrication method of low-cost and mass producible silicon nanowire, in which a silicon substrate is catalyzed by sensitizer and activator so that reacting metal atoms can be adsorbed on the surface of the silicon substrate. The processed silicon substrate is then dipped in an acidic electroless plating solution for electroless deposition in order to form a metal layer containing catalytic metal particles on the silicon substrate. Next, this silicon substrate is heated in a tubular oven to catalyze metal particles and silicon atoms on the surface of the silicon substrate to form liquid silicide alloy at the metal/silicon interface. Subsequently, a solid-liquid-solid (SLS) chemical synthesis process prompts rearrangement of silicon-silicon bonds due to catalyst effect through temperature gradient so as to form silicon nanowire by stacking. Although this disclosure can mass produce silicon nanowire, the problem of alignment will still be encountered when fabricating FETs. Moreover, there is doubt of contamination by residual catalytic metal.

In the paper "FinFET SONOS flash memory for embedded applications" disclosed by P. Xuan et al. in 2003, the thickness of a silicon film is reduced from 100 nm to 40 nm on a fully-depleted (FD)-SOI wafer by means of thermal oxidation and etching, and a fin-shaped channel is then defined by means of E-beam lithography. Next, a silicon oxide film, a silicon nitride film and a silicon oxide film are grown in turn to form a gate dielectric stack structure of oxide/nitride/oxide (ONO). Subsequently, an n-type poly-Si film is deposited, and a gate is defined by means of E-beam lithography so as to form a FinFET SONOS memory device. However, advanced techniques and expensive SOI wafer and E-beam lithography equipments are required in these process steps.

In the paper "Nonvolatile memory and programmable logic from molecule-gated nanowires" disclosed by X. Duan et al. in 2002, a nanowire metal seed is used as the medium for the fabrication of nanowires, and nanowires are then sprayed on a silicon wafer covered by an insulator. Next, metal electrodes are formed by means of E-beam evaporation, and the positions of electrodes are defined by means of E-beam lithography so that the electrodes can be connected with nanowires to finish the fabrication of an FET with nanowire channel. However, the reproducibility of devices fabricated in this manner is low, and there is doubt of residual metal seed in nanowires. Moreover, there exists the problem of accurate alignment of nanowires on the wafer.

SUMMARY OF THE INVENTION

An object of the present invention is to provide a nonvolatile memory device with nanowire channel and a method for fabricating the same. With techniques compatible to existent semiconductor manufacturing process and equipments, a nanowire pattern is formed by means of sideward etching. The dimension of nanowire can be controlled to be smaller than 20 nm by adjusting the etching conditions. Through a process of low cost and easy steps, highly reproducible and mass producible fabrication of nanowire devices can be accomplished to solve the problems of difficult fabrication of nanowire devices, high cost, and high technology threshold in the prior art.

Another object of the present invention is to provide a nonvolatile memory device with nanowire channel and a method for fabricating the same, in which easy steps and low-cost equipments are used to accomplish dual-gate control and nanowire channel so as to enhance data writing and erasing efficiency and also achieve the capability of low voltage operation.

To achieve the above objects, the present invention provides a nonvolatile memory device with nanowire channel and a method for fabricating the same. The method comprises the steps of: providing a substrate covered by an insulator; forming in turn a first conductor layer and a dielectric and then defining a first structure; shrinking two sides of the first conductor layer in the first structure, and controlling a shrinkage space to be smaller than 100 nm in order to construct a nanowire pattern and form a first gate; forming in turn a first gate dielectric and a semiconductor layer; defining a source and a drain through ion implantation to the semiconductor layer, and forming a nanowire channel on the first gate dielectric of side walls of the first gate by means of lithography; forming in turn a second gate dielectric and a second conductor layer, and finally defining a second gate. A nonvolatile memory device with dual-gate structure is thus finished.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

FIGS. 1A to 1H are cross-sectional views of the process flow of a nonvolatile memory device with dual gate and nanowire channel according to an embodiment of the present invention.

Figure 1A:
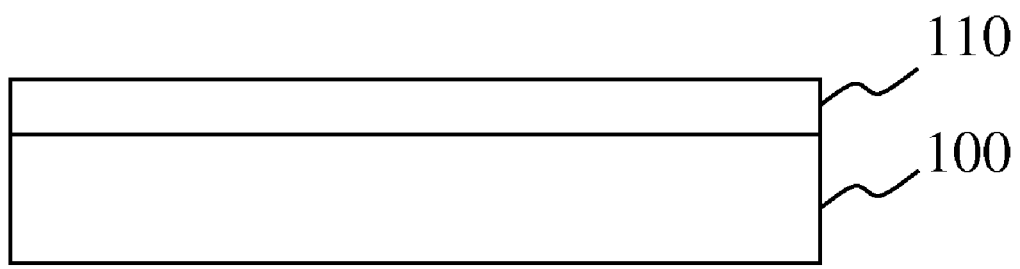
FIGS. 1A to 1H are cross-sectional views of the process flow of a nonvolatile memory device with dual gate and nanowire channel according to an embodiment of the present invention, and FIG. 1C specifically illustrates how oxide at two sides of a side-gate is removed by means of thermal oxidation.

First, as shown in FIG. 1A, a silicon wafer 100 covered by an insulator 110 is provided as a substrate.

Figure 1B:
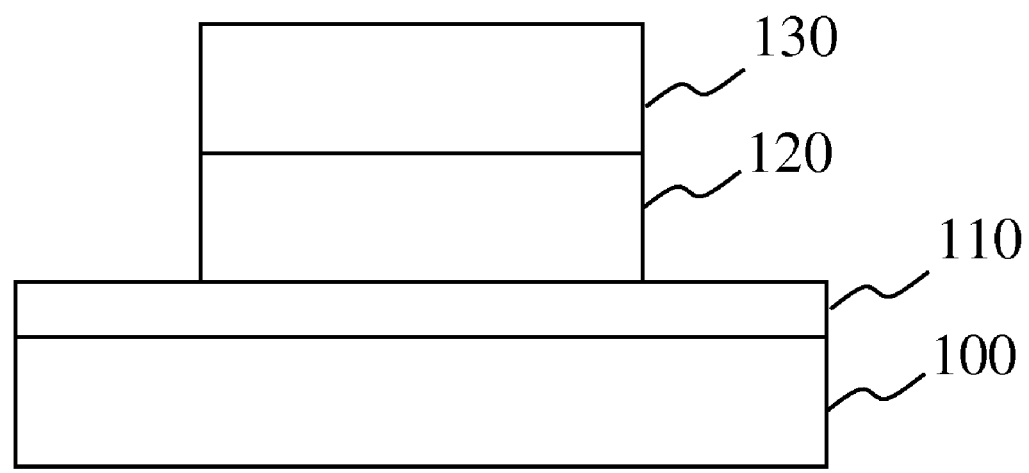

As shown in FIG. 1B, a poly-Si and a dielectric are deposited in turn, and a side-gate 120 and a hard mask 130 are defined by means of lithography.

Figure 1C:
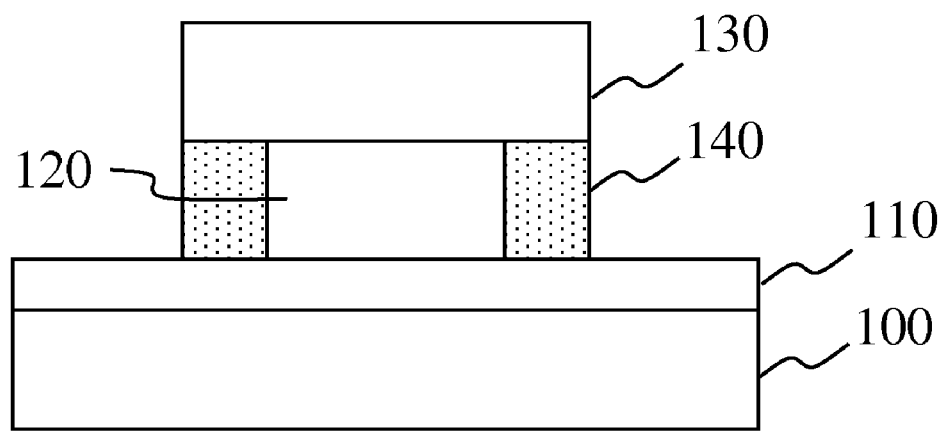
Figure 1D:
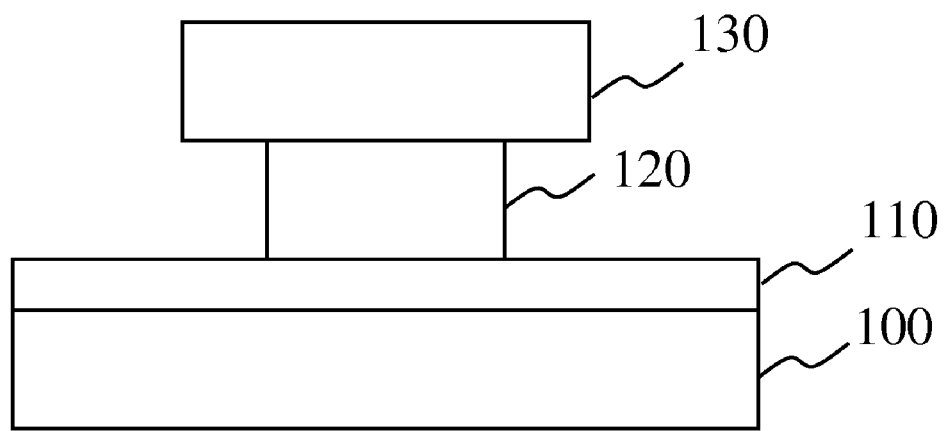

Next, two sides of the side-gate 120 are shrunk, and this shrinkage space is controlled to be smaller than 100 nm to construct a nanowire pattern. This is achieved by one of the following two manners:

(a) As shown in FIG. 1C, the poly-Si side gate 120 is thermally oxidized to a predetermined thickness to deplete poly-Si at the two sides of the side-gate, and this poly-Si oxide 140 is then removed, thereby controlling the shrinkage space to be smaller than 100 nm, as shown in FIG. 1D;

(b) As shown in FIG. 1D, the two sides of the poly-Si side-gate are directly shrunk by means of selective wet etching or isotropic plasma etching. The shrinkage space can be controlled to be smaller than 100 nm by adjusting etching condition and time.

Figure 1E:
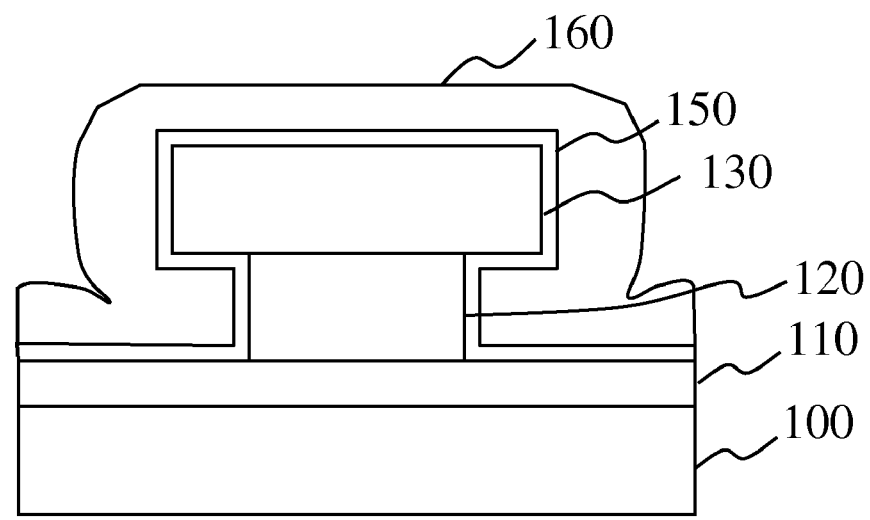

As shown in FIG. 1E, a dielectric I 150 used as the side-gate dielectric and a poly-Si (or amorphous Si) are deposited in turn to let the dielectric I 150 have a uniform first thickness in the shrinkage space and the poly-Si 160 be able to totally fill the shrinkage space with no holes.

Figure 1F:
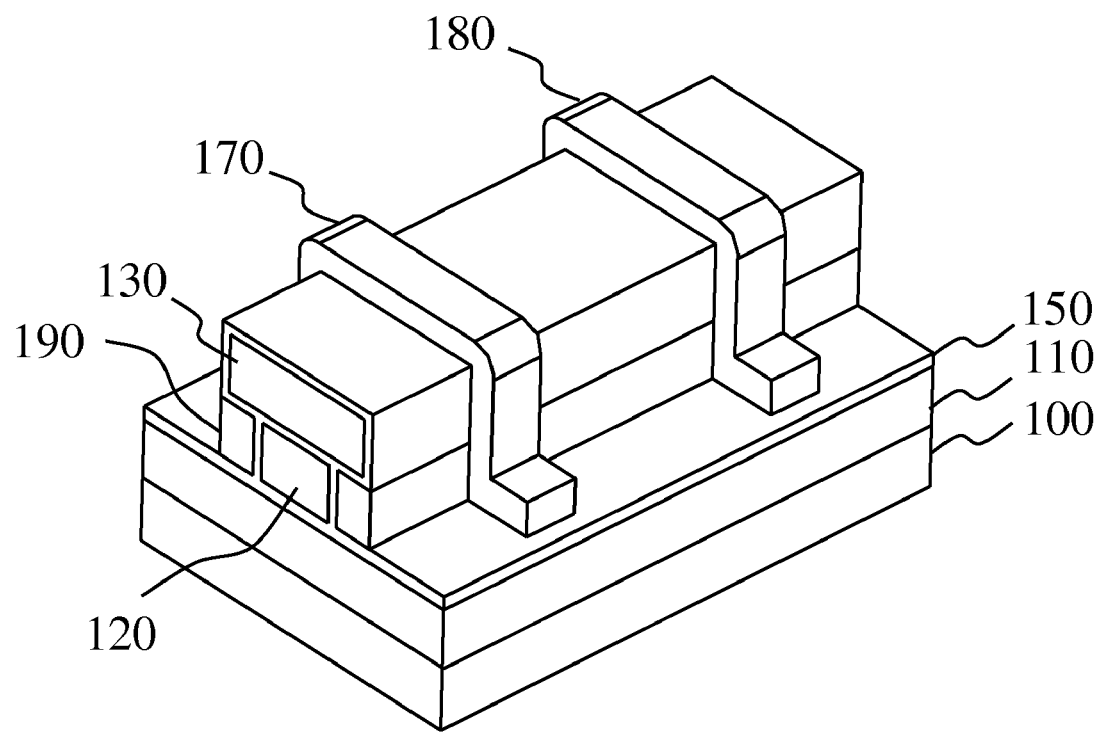

Subsequently, as shown in FIG. 1F, ion implantation is performed to dope p-type or n-type impurities, and lithography and anisotropic dry etching are used to define the regions of a source 170 and a drain 180. During etching, the poly-Si 160 in the shrinkage space can be completely kept to form a nanowire channel 190 on the dielectric I 150 of side walls of the side-gate 120.

Next, the above doped impurities are annealed and activated.

Figure 1G:
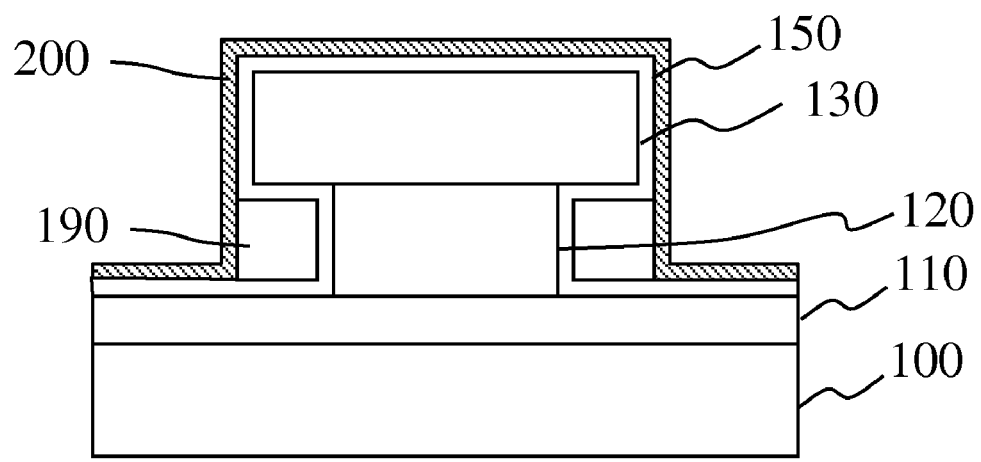

As shown in FIG. 1G (in which the source 170 and the drain 180 are omitted), after the formation of the nanowire channel, 190, a dielectric II 200 is deposited.

Figure 1H:
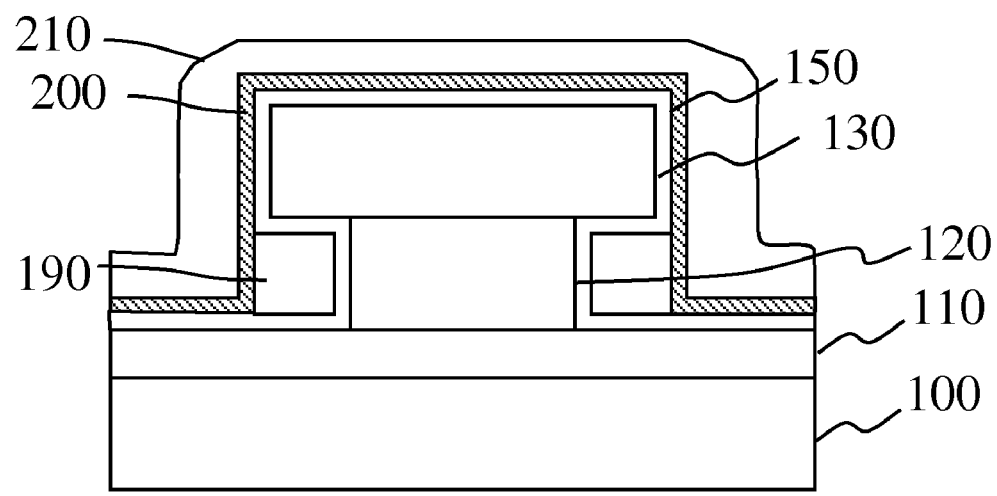

As shown in FIG. 1H, a top-gate 210 is deposited and defined. A nonvolatile memory device with a dual-gate structure and nanowire channel is thus finished.

In this embodiment, at least one of the dielectric I 150 and the dielectric II 200 is a charge storage layer, which can be a stack structure of oxide/charge trapping layer/oxide (O/X/O), or a stack structure of oxide/nitride/oxide/charge trapping layer/oxide (O/N/O/X/O). The charge trapping layer (X) can be $SiN_x$, $HfO_2$, $HfSiO_x$, or $Al_2O_3$; or the charge storage layer is a dielectric containing nano particles, which can be silicon nanocrystals, germanium nanocrystals, metal nanocrystals, or $HfO_2$ nanocrystals.

This nonvolatile memory device has the following two operation modes:

(a) The side-gate is used as control gate and the top-gate is used as an auxiliary gate to help charges tunnel to the charge trapping layer (dielectric I) so as to enhance data writing/erasing efficiency.

(b) The top-gate is used as a control gate and the side-gate is used as an auxiliary gate to help charges tunnel to the charge trapping layer (dielectric II) so as to enhance data writing/erasing efficiency.

According to the method for fabricating a nonvolatile memory device with nanowire channel of the present invention, the required wafer material and exposure equipment are common silicon wafer and G-line stepper. Moreover, the fabrication process is a common TFT fabrication process. Therefore, the present invention has the advantages of low cost and simple technology.

Moreover, the fabrication method of the present invention has very good alignment and reproducibility. Not only can nanowires be mass produced, but nanowire channel can also be precisely arranged in FETs. Besides, there is no doubt of metal contamination.

Furthermore, although the nanowire material is initially of poly-crystalline state, it can be changed to high-quality single-crystalline state by the present low-temperature recrystallization technique to enhance the reliability of channels during operation.

There are many variations of the nanowire memory device structure of the present invention. Through different architectures of gate and gate dielectric, many feasible nanowire nonvolatile memory devices can be achieved, and they can operate under low voltage environment to improve the reliability problem of memory device.

The floating gate technique is the present mainstream technique of nonvolatile memory, but its structure is unfavorable for miniaturization and future development, and is expected to be replaced with SONOS or similar techniques. The present invention has the advantages of simple process, low production cost, and dual gate operation for improvement of characteristics. Moreover, 3-dimensional stack can be used to increase the storage capability. Therefore, the present invention has a large application potential.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. A nonvolatile memory device with nanowire channel comprising:
   a substrate with an insulator on a surface thereof;
   a first structure including a first gate and a dielectric, said first gate being located on said insulator, two sides of said first gate shrinking below said dielectric to form a shrinkage space smaller than 100 nm;
   a first gate dielectric formed on surfaces of said insulator, said first gate and said dielectric;
   a semiconductor layer including a source and a drain formed on said first gate dielectric and a nanowire channel formed in said shrinkage space on said first gate dielectric of side walls of said first gate;
   a second gate dielectric formed on surfaces of said first gate dielectric, said nanowire channel, said source and said drain; and
   a second gate formed on said second gate dielectric and at least covering said nanowire channel.

2. The nonvolatile memory device of claim 1, wherein at least one of said first gate dielectric and said second gate dielectric is a charge storage layer.

3. The nonvolatile memory device of claim 2, wherein said charge storage layer is a stack structure of oxide/charge trapping layer/oxide (O/X/O), or a stack structure of oxide/nitride/oxide/charge trapping layer/oxide (O/N/O/X/O).

4. The nonvolatile memory device of claim 3, wherein said charge trapping layer (X) is $SiN_x$, $HfO_2$, $HfSiO_x$, or $Al_2O_3$.

5. The nonvolatile memory device of claim 2, wherein said charge storage layer is a dielectric containing nano particles.

6. The nonvolatile memory device of claim 5, wherein said nano particles are silicon nanocrystals, germanium nanocrystals, metal nanocrystals, or $HfO_2$ nanocrystals.

7. A method for fabricating a nonvolatile memory device with nanowire channel comprising the steps of:

providing a substrate with an insulator on a surface thereof;

forming in turn a first conductor layer and a dielectric on said insulator, and defining a first structure by means of lithography;

shrinking two sides of said first conductor layer in said first structure and controlling a shrinkage space to be smaller than 100 nm in order to form a first gate;

forming a first gate dielectric on surfaces of said insulator, said first gate and said dielectric;

forming a semiconductor layer on said first gate dielectric and also filling said shrinkage space;

performing ion implantation to said semiconductor layer, defining a source and a drain by means of lithography to form a nanowire channel on said first gate dielectric of side walls of said first gate;

forming a second gate dielectric on surfaces of said first gate dielectric, said nanowire channel, said source and said drain; and forming a second conductor layer, and defining a second gate by means of lithography.

8. The method of claim 7, wherein at least one of said first gate dielectric and said second gate dielectric is a charge storage layer.

9. The method of claim 8, wherein said charge storage layer is a stack structure of oxide/charge trapping layer/oxide (O/X/O), or a stack structure of oxide/nitride/oxide/charge trapping layer/oxide (O/N/O/X/O).

10. The method of claim 9, wherein said charge trapping layer (X) is $SiN_x$, $HfO_2$, $HfSiO_x$, or $Al_2O_3$.

11. The method of claim 8, wherein said charge storage layer is a dielectric containing nano particles.

12. The method of claim 11, wherein said nano particles are silicon nanocrystals, germanium nanocrystals, metal nanocrystals, or $HfO_2$ nanocrystals.

13. The method of claim 7, wherein said step of shrinking two sides of said first conductor layer is achieved by means of selective etching, isotropic plasma etching, or by thermally oxidizing two sides of said first conductor layer and then removing the oxide of said first conductor layer.

* * * * *